United States Patent [19]

Canestrari et al.

[11] Patent Number: 5,622,796
[45] Date of Patent: Apr. 22, 1997

[54] PROCESS FOR PRODUCING METROLOGICAL STRUCTURES PARTICULARLY FOR DIRECT MEASUREMENT OF ERRORS INTRODUCED BY ALIGNMENT SYSTEMS

[75] Inventors: Paolo Canestrari, Merate; Samuele Carrera, Cavenago; Giovanni Rivera, Castiglione Delle Stiviere, all of Italy

[73] Assignee: SGS-Thomson Microelectronics S.r.l., Agrate Brianza, Italy

[21] Appl. No.: 363,231

[22] Filed: Dec. 22, 1994

Related U.S. Application Data

[63] Continuation of Ser. No. 990,449, Dec. 15, 1992, abandoned.

[30] Foreign Application Priority Data

Dec. 18, 1991 [IT] Italy .................................. MI91A3385

[51] Int. Cl.⁶ ......................................................... G03F 9/00
[52] U.S. Cl. .............................. 430/22; 438/975; 438/16
[58] Field of Search ............................ 430/22; 156/659.1

[56] References Cited

U.S. PATENT DOCUMENTS 4,125,427  11/1978  Chen et al. ................................ 156/657
4,650,744  3/1987  Amano ..................................... 430/313
5,246,539  9/1993  Canestrari et al. ................... 156/659.1

FOREIGN PATENT DOCUMENTS 0080619  6/1983  European Pat. Off. ......... H01L 23/54

OTHER PUBLICATIONS

IBM Technical Disclosure Bulletin, vol. 26, No. 10B, Mar. 1984, New York US, p. 5395, H.R. Rottmann "Method For Statistical Performance Measurements Of A Lithographic System".

International Electron Devices Meeting, Dec. 6–9, 1987, Washington US, Technical Digest 1988, New York US, pp. 749–752 K. Yamashita et al. "Holographic Nanometer Alignment System For A Half–Micron Wafer Stepper".

Patent Abstracts of Japan, vol. 13, No. 168 (E–747) Apr. 21, 1989 & JP–A–64001232 (Mitsubishi Electric Corp.).

*Primary Examiner*—Mark Chapman
*Attorney, Agent, or Firm*—David M. Driscoll; James H. Morris; Richard F. Giunta

[57] ABSTRACT

Process for producing metrological structures particularly for direct measurement of errors introduced by alignment systems, whose peculiarity consists in performing, on a same substrate, metrological alignment markings and processed alignment markings according to arrays of preset numerical size.

70 Claims, 3 Drawing Sheets

PROCESS FOR PRODUCING METROLOGICAL STRUCTURES PARTICULARLY FOR DIRECT MEASUREMENT OF ERRORS INTRODUCED BY ALIGNMENT SYSTEMS

This application is a continuation of U.S. patent application Ser. No. 07/990,449, now abandoned filed Dec. 15, 1992, entitled PROCESS FOR PRODUCING METROLOGICAL STRUCTURES PARTICULARLY FOR DIRECT MEASUREMENT OF ERRORS INTRODUCED BY ALIGNMENT SYSTEMS.

BACKGROUND OF THE INVENTION

The present invention relates to a process for producing metrological structures particularly used for direct measurement of errors introduced by alignment systems.

As is known, registering among successive maskings is particularly critical in the photolithographic process used in the production of integrated circuits.

Registering is achieved conventionally by the exposure device, technically known as a stepper machine, by identifying appropriate alignment markings defined both on the substrate and on layers which are deposited or grown on the substrate. The apparatus, whether electronic, optical, mechanical or based on any combination of these systems, that performs the recognition of the alignment markings is technically known as an alignment system.

The alignment markings are altered by successive production steps, including deposition of materials, growth of oxides and the like. In any case, by using the reference pattern obtained with marking recognition, or the image of the grid, the image is projected with precise coordinates on the entire surface of the substrate being processed.

Registering error is usually due to various concurrent causes. This error depends on an error in recognizing the alignment marking, which is caused for example by an alteration thereof during the production steps, such as by a distortion of the optical system used in the photolithographic process, by an error in the positioning of the mechanical bench which supports the substrate, by an error in writing the mask, or by a distortion of the substrate itself.

The various described components generally have a contribution of the same order of magnitude and produce misalignments which can be interpreted and discriminated only by using complex interpretative models, so that it is difficult to exactly and assuredly identify the source of each individual contribution to the statistical distributions of the registering measurements performed on the processed substrates. Furthermore, as is equally known, the alignment measurement instruments themselves are affected by an instrument error which is not negligible. Such statistical investigations require a large number of samples of processed substrates, which have a significant cost. This cost presents an added drawback to performing accurate error evaluation.

One of the conventional methods used to evaluate the error in recognizing the alignment marking consists in measuring the register between two successive masking levels on processed substrates by using appropriate misalignment measurement instruments which use dedicated structures with measurement profiles defined on the substrate itself. The values obtained are then evaluated and compared to one another in order to discriminate the degradation introduced by each individual layer, such as a metallization layer, a polysilicon layer, a silicon nitride layer and other such layers.

In evaluating the measured data, it is furthermore necessary to take into account the fact that when comparing different distributions, for example each obtained with a different adjustment of the alignment system, the differences observed in the measurements depend exclusively on the intervention performed and not on drifts of the mechanical supporting bench or alterations of the lens or statistical fluctuations.

In particular, statistical fluctuations are particularly important, since they are linked to the technical requirements of the production process. As is known from statistics, it is in fact necessary to take into account the trailing values of the distributions up to three times the variance shown by the entire set of measurements or samples obtained, since the trailing values of the distributions are more severely affected by statistical fluctuations.

Finally, as also known from statistics, the larger the number of samples used, the better will be the approximation provided by statistical measurement. Thus, since the number of alignments per individual substrate is normally rather small, it is necessary to have a considerable number of substrates on which the measurements can be performed; this need is currently contrasted by the high cost of said substrates, which provides a deterrent to using a large number of samples.

SUMMARY OF THE INVENTION

The aim of the present invention is to eliminate or substantially reduce the problems described above by providing a process for producing metrological structures particularly suited for direct measurement of errors introduced by alignment systems, which allows an accurate, precise and rapid measurement of the alignment marking recognition error in order to qualify and optimize an alignment system and, in any case, to improve the characteristics of the exposure instrument, thus allowing a better integration of the device.

Within the scope of the above aim, an object of the present invention is to provide a process which allows optimization of an alignment system by modifying the operating parameters of the system, improving the numerical size and placement of the alignment markings and modifying the sequence of the layers removed or left above the alignment markings or intervening in the process for the deposition of a layer.

Another object of the present invention is to provide a process which meets the above aim and is highly reliable, relatively easy to perform and inexpensive.

The above aim, objects and other objects and advantages are achieved by a process for producing metrological structures particularly suited for direct measurement of errors introduced by alignment systems. This process includes simultaneous execution, on a common substrate, of metrological alignment markings and of processed alignment markings according to arrays of preset numerical size. This process further includes defining a plurality of alignment markings through an etching process through a first layer on the substrate, thereafter generating isolated regions of a second layer on the markings upon the first layer.

BRIEF DESCRIPTION OF THE DRAWINGS

Further characteristics and advantages of the invention will become apparent from a reading of the following detailed description of some preferred but not exclusive embodiments of a process for producing metrological structures particularly suited for direct measurement of errors introduced by alignment systems according to the invention, illustrated only by way of non-limiting examples in the accompanying drawings, wherein.

DESCRIPTION OF THE PREFERRED EMBODIMENTS

Hereinafter, the term "to mask" or "masking" designates the per se known photolithographic process by means of which a first material is made soluble or insoluble by exposure to a source of radiation which is controlled and filtered by a mask which bears the layout of the individual layer. In most practical cases, the first material is constituted by photosensitive resin, technically known as "photoresist", as used hereinafter, whereas the radiation source is usually a source of electromagnetic radiation in the visible-light range. The term "etching" designates the chemical incision of the layers of the calibration structure.

The process according to the invention entails the execution within one process, on a same substrate, of metrological alignment markings and of processed alignment markings according to arrays having a preset numerical size, followed by the measurement of the positions of the metrological markings and of the processed markings, then followed by a statistical analysis of the measurement data.

Figure 5:
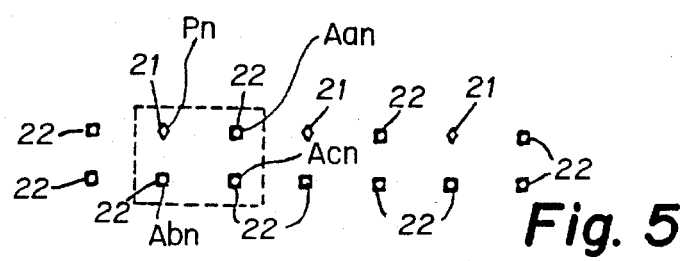
FIG. 5 is a view of an example of an array of metrological alignment markings and of processed alignment markings.

The process according to the invention simultaneously produces on the same substrate arrays, as illustrated in FIG. 5, metrological alignment markings, which are easily identifiable markings, and alignment markings processed by the industrial production conditions at relative distances which are measurable and possibly known and with the possibility of measuring the error in recognizing the correct position of the markings by means of measurements of relative distances performed with the reference of an interferometric mechanical bench.

The accuracy of the relative distance between neighboring markings is obtained by tracing all the markings on the same mask. The high accuracy of the writing machine, the reduction factor (typically fivefold) of the measurement machine, which obviously reduces the positioning errors of the markings on the mask by the same factor, and the almost complete lack of errors introduced by distortion when considering small distances, which distances are smaller than one millimeter, provide for alignment markings at known distances with a substantially negligible error.

The cosine error due to rotation of the exposure field with respect to the interferential bench is usually also negligible, since it is automatically corrected by the stepper machine at the beginning of the alignment sequence. Without losing in generality, the process according to the invention can be applied even in the presence of magnification errors and of cosine errors, since the measurement can be recalibrated on the distance measured between two metrological markings, so that the optimum measurement sequence can be chosen according to the characteristics of the instrument to be checked.

Stepper machines currently in use have a mechanical bench which is controlled by an interferometric system which allows one to correlate the position where the alignment marking is detected with a coordinate of the X/Y plane.

Figure 1A:
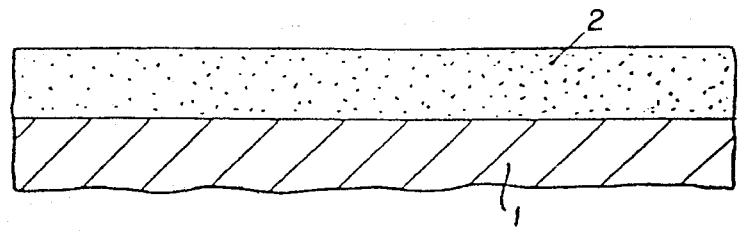
FIGS. 1a to 1f are views of the steps performed in a first embodiment of the process according to the invention.
Figure 1B:
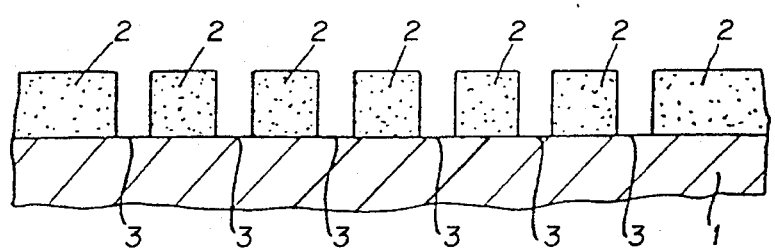
Figure 1C:
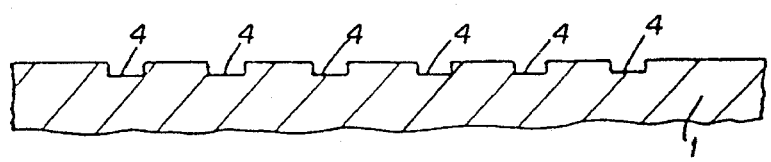
Figure 1D:
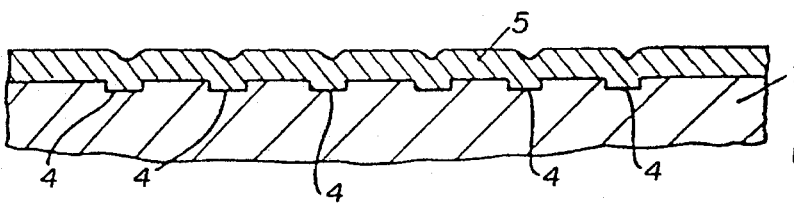
Figure 1E:
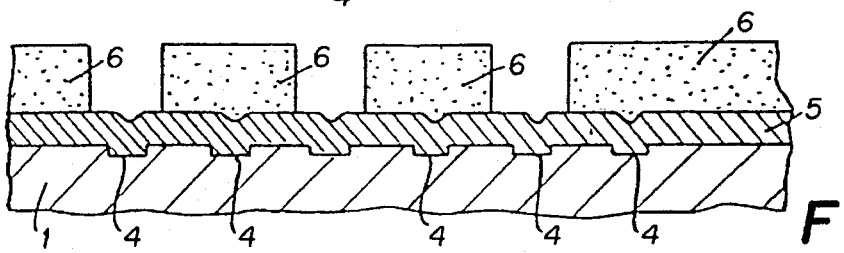
Figure 1F:
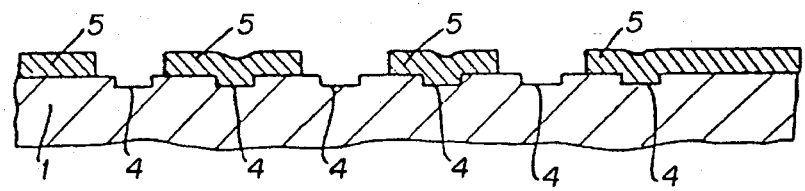

A first embodiment of the process according to the invention, with reference to FIGS. 1a to 1f, provides the following steps, starting from a substrate such as, for example, silicon designated by the reference numeral 1:

a first deposition step, during which, as illustrated in FIGS. 1a and 1b, a first layer 2 of a first material, usually photoresist, is deposited on the substrate 1 and is then masked; soluble portions thereof are removed, uncovering substrate portions 3;

a first etching step, during which, as illustrated in FIGS. 1b and 1c, the portions 3 of the substrate 1 are etched in order to provide a plurality of alignment markings 4 in the substrate, and the subsequent removal of the remaining portions of the first layer 2;

a second deposition step, during which, as illustrated in FIG. 1d, a second layer 5 of a second material is deposited on the substrate 1;

a third deposition step, during which, as illustrated in FIG. 1e, a third layer 6 of photoresist is deposited on the second layer 5 and is subsequently masked, the soluble portions thereof being subsequently removed, uncovering portions of the second layer 5 which are arranged over the alignment markings 4;

a second etching step, in which, as illustrated in FIG. 1f, the second layer 5 is etched at its uncovered portions, followed by the elimination of the remaining portions of the third layer 6, uncovering isolated regions, still designated by the reference numeral 5, of the second layer; and a measurement step, during which the relative distances between pairs of isolated regions 5, also called "processed alignment markings", and between metrological alignment markings 4, are measured, with a subsequent analysis of the measured data. With this sequence of steps, it is possible to discriminate and estimate the contribution to the total measurement error introduced by the presence of photoresist on the insulated regions 5.

Figure 2:
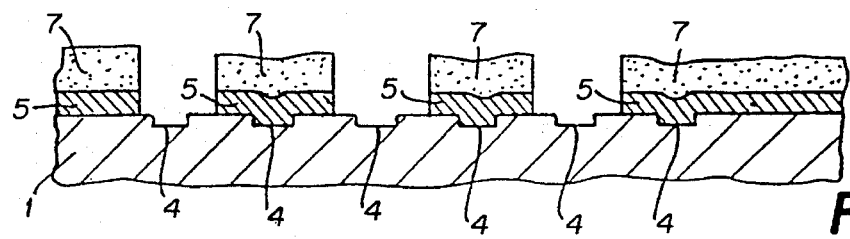
FIG. 2 is a view of a further step of the first embodiment.

In order to exactly reproduce the conditions of the substrate 1 before it is subjected to an exposure, a fourth layer 7 of photoresist is deposited (see FIG. 2) between the second etching step and the measurement step; the photoresist layer 7 is masked and its soluble portions, arranged at the alignment markings 4, are removed, providing isolated regions whose residual second layer 5 is covered by portions of the fourth layer 7.

Advantageously, the second material is preferably aluminum silicate, but it might be for example, silicon, polysilicon or metal.

Figure 3A:
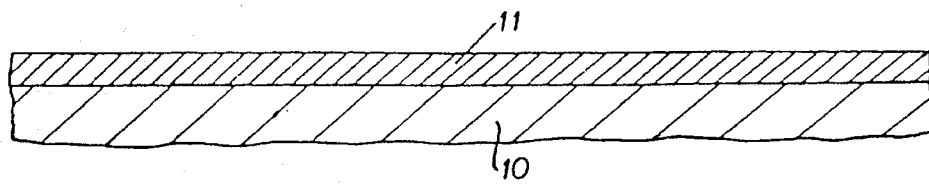
FIGS. 3a to 3j are views of the steps performed in a second embodiment of the process according to the invention.
Figure 3B:
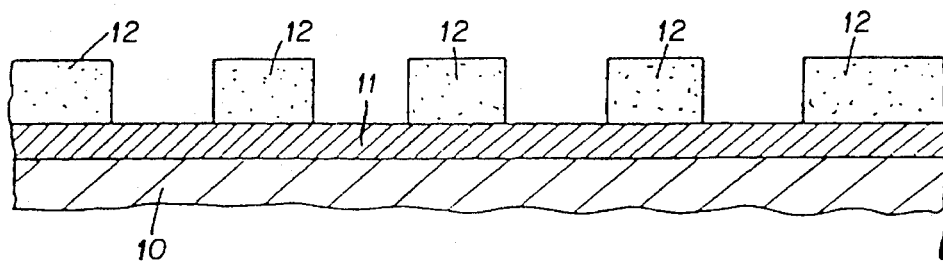
Figure 3C:
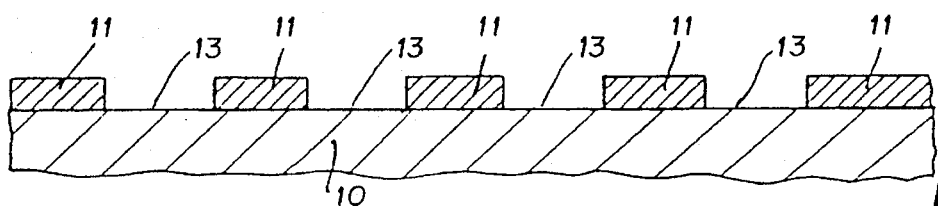
Figure 3D:
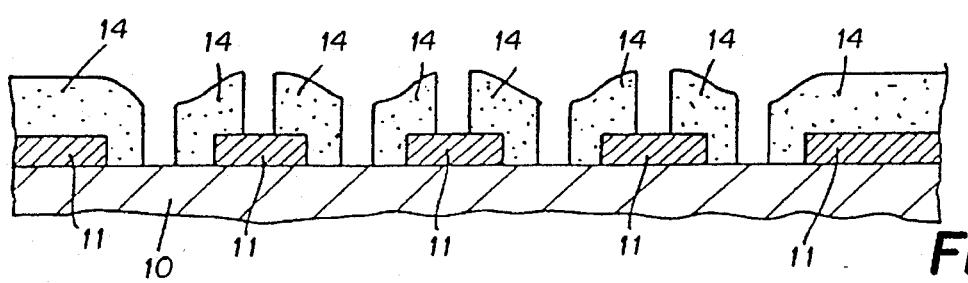
Figure 3E:
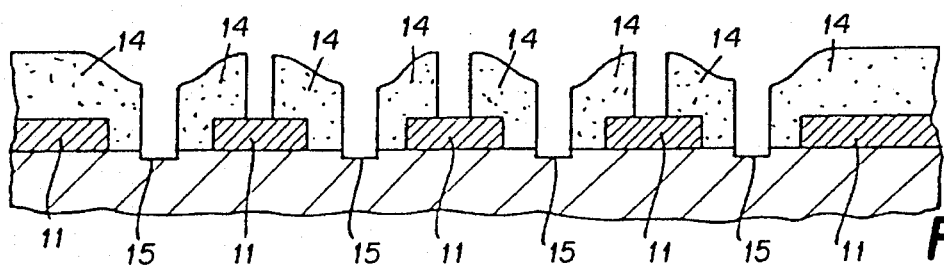
Figure 3F:
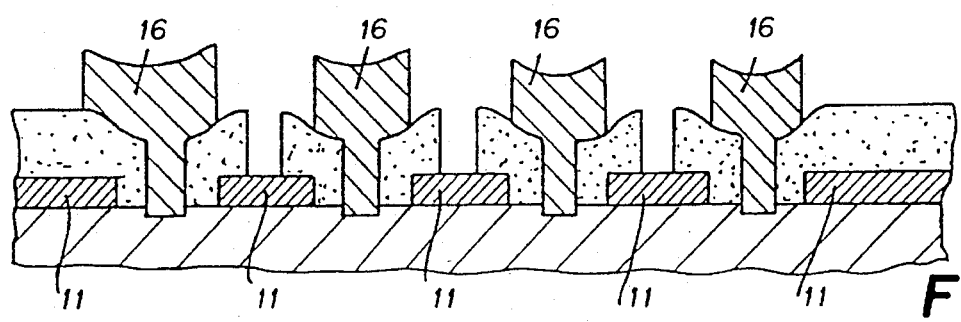
Figure 3G:
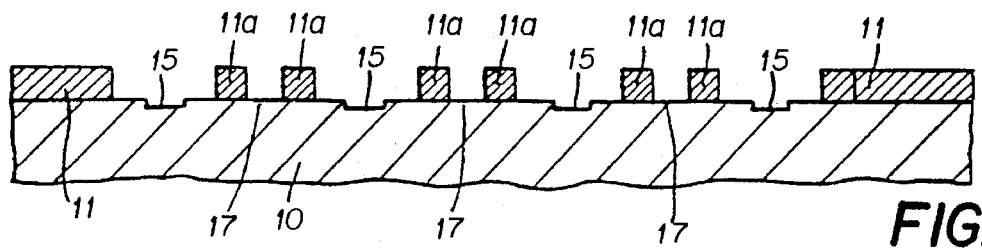
Figure 3H:
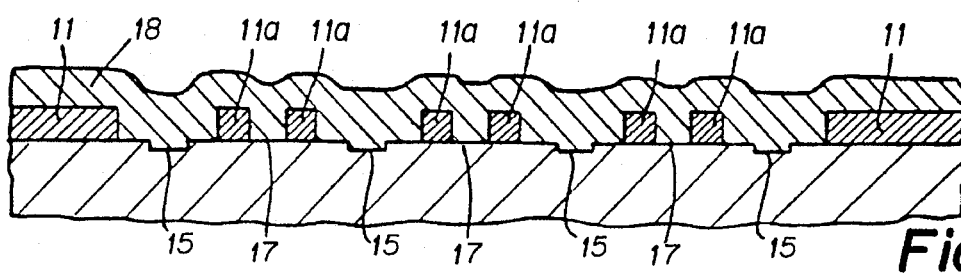
Figure 3I:
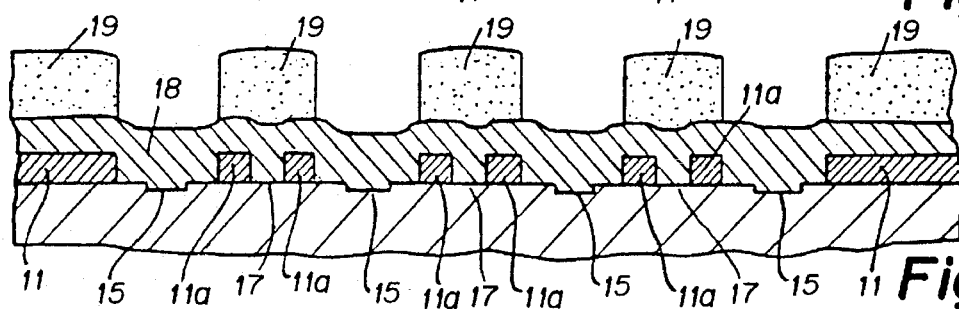
Figure 3J:
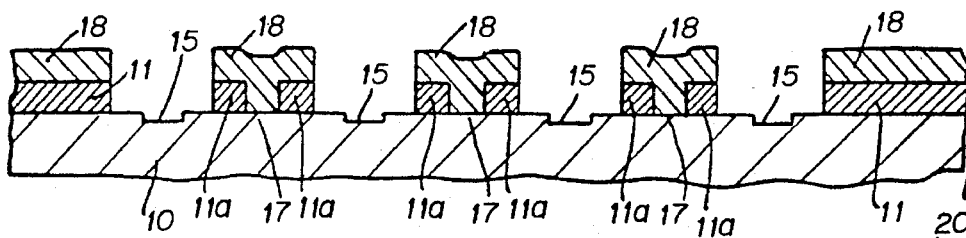

A second embodiment of the process according to the invention, with reference to FIGS. 3a to 3j, entails the following steps, starting from a substrate, which may be, for example, silicon or silicon with a layer of oxide designated by the reference numeral 10:

a first deposition step, during which, as illustrated in FIG. 3a, a first layer 11 of a first material which may be, for example, silicon oxide or polysilicon is deposited on the substrate 10;

a second deposition step, during which, as illustrated in FIG. 3b, a second layer 12 of a second material, preferably photoresist, is deposited on the first layer 11 and is masked; soluble portions thereof are then removed, leaving uncovered portions of the second layer 11;

a first etching step, during which, as illustrated in FIG. 3c, the first layer 11 is etched in order to uncover portions 13 of the substrate 10 and the residual portions of the second layer 12 are then removed;

a third deposition step, during which, as illustrated in FIG. 3d, a third layer 14 of photoresist is deposited and is subsequently masked with an array of equidistant markings; soluble portions thereof are subsequently removed, uncovering portions of the substrate 10 and of the first layer 11;

a second etching step, during which, as illustrated in FIG. 3e, the substrate 10 is etched so as to define metrological alignment markings 15 in the substrate 10. During the second etching step, due to the selectivity of the etching, the uncovered portions of the first layer 11 are not completely etched by the etching step aimed at the substrate 10;

a fourth deposition step, during which, as illustrated in FIG. 3f, a fourth layer 16 of photoresist is deposited (the previous layer of photoresist 14 is not removed) and then masked, soluble portions thereof being then removed so as to uncover portions of the first layer 11 which correspond to the areas which were not completely etched;

a third etching step, during which, as illustrated in FIG. 3g, the first layer 11 is etched in order to uncover portions of the substrate 10 and define isolated regions, designated by the reference numerals 11 and 11a, of the second layer, followed by the removal of the residual portions of the fourth layer 16 and of the third layer 14, the isolated regions 11a define the processed alignment marks 17;

a fifth deposition step, during which, as illustrated in FIG. 3h, a sixth layer 18 of a third material which may be, for example, polysilicon or metal, is deposited on the substrate 10 and on the isolated regions 11 and 11a;

a sixth deposition step, during which, as illustrated in FIG. 3i, a seventh layer 19 of photoresist is deposited and masked, soluble portions thereof arranged at the alignment markings 15 being removed;

a fourth etching step, during which, as illustrated in FIG. 3j, the sixth layer 18 is etched in order to uncover the alignment markings 15, followed by the removal of the residual portions of the seventh layer 19, which leaves the isolated regions 11 and 11a covered by portions of the sixth layer 18; and a measurement step, during which the positions of processed alignment marks 17 and of the metrological alignment markings 15 are measured, with a subsequent analysis of the measured data, as described in more detail hereinafter. With this sequence of steps it is possible to discriminate and estimate the contribution to the total measurement error introduced by the presence of photoresist on the portions of the sixth layer 18.

Figure 4:
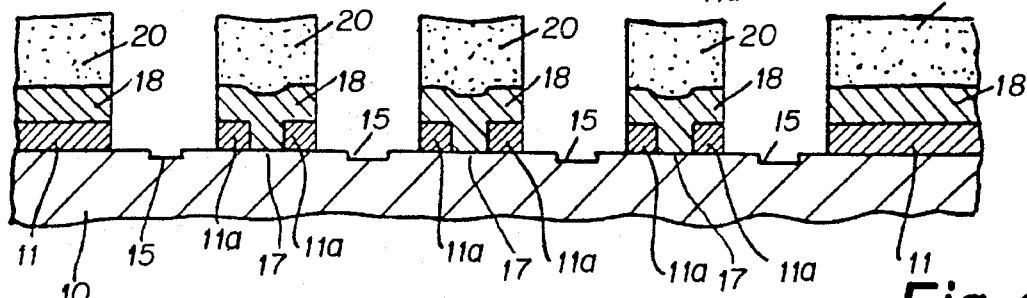
FIG. 4 is a view of a further step of the second embodiment.

In order to exactly reproduce the conditions of the substrate 10 prior to being subjected to an exposure, the deposition of an eighth layer 20 of photoresist is performed (see FIG. 4) between the fourth etching step and the measurement step; the layer 20 is masked and its soluble portions located at the alignment markings 15 are removed, defining isolated regions whose residual sixth layer 18 is covered by portions of the eighth layer 20.

Conveniently, the first material is contact dielectric, whereas the third material is aluminum silicate, but they could be any one of the previously described materials.

With reference to FIG. 5, the reference numeral 21 designates metrological alignment markings, whereas the numeral 22 designates processed alignment markings (i.e. markings subjected to deposition operations and the like).

A first measurement and statistical analysis procedure entails, if Pn, Aan, Abn and Acn are the relative positions of the elements which form an array (see FIG. 5), the measurement, by means of the alignment system, of the position along the X-axis of the n-th processed alignment marking 21 and of the n-th metrological alignment marking 22.

The relation, $$(Pnx-Aanx)-(Abn-Acn)=Mnx,$$

provides the gross detection error M. This gross error contains the error in detecting the position of the processed marking 21 and of the metrological markings 22, which errors, however, are usually small.

Furthermore, the relation, $$Abnx-Acnx=Knx,$$

allows determination of the value K of the relative distance of pairs of metrological markings 22.

Once a relatively large number N of samples, or of relative distance measurements, has been acquired, the estimate of the average error <Kx> of the distance between the metrological markings 22 is given by:

$$<Kx> = \left( \sum_1^N Knx \right) /N$$

whereas the standard deviation σ Kx of the statistical error in the measured sample is given by:

$$\sigma Kx = \left( \sum_1^N (Knx - <Kn>)^2 \right) /(N-1)^{1/2}$$

The standard deviation σβx of the statistical error in the measurement of a single marking is given by:

$$\sigma\beta x = ((\sigma Kx)_2/2)^{1/2}.$$

It is, therefore, possible to determine the statistical error Rx of the measurement of the position of the processed marking as:

$$\sigma Rx = ((\sigma Mx)^2 - (\sigma\beta x)^2)^{1/2}.$$

Thus, the corrected error <Rx> in positional detection of the processed marking is given by:

$$<Rx> = \left( \sum_1^N Mnx \right) /N = <Mn>$$

The procedure described herein for relative positions detected along the axis X of the abscissae can be repeated for the measurement of the relative positions measured along the axis Y of the ordinates.

If the distance "d" between two markings is known, it is sufficient to enter "d" in the place of "Abn−Acn" and thus obtain:

$$<Kx>=d,$$

and $$\sigma Rx = ((\sigma Mx)^2 - (\sigma\beta x)^2)^{1/2}.$$

Other procedures can be used to improve the detail of the estimate; to improve statistical efficiency and/or accuracy and/or to adapt the above described algorithm, which relates to measurements performed on substrates produced by following the process according to the invention, to the peculiarities of the alignment system to be evaluated.

Advantageously, the process according to the invention allows one to directly measure the error in detecting the position of the alignment markings, which was previously practically impossible with available methods.

Conveniently, it is possible to perform hundreds of measurements on different markings on the same substrate, allowing a rapid and economical accumulation of a sample of measurements having a significant numerical size, which ensures excellent statistical analysis.

Advantageously, the measurements can be obtained directly by a stepper machine without resorting to special exposures and developings of a first material and to treatments of the substrate in order to improve the accuracy of the measurement of the alignment.

Conveniently, specialized measurement systems, which are always expensive and sophisticated, are not used; the interferometric alignment systems present on stepper machines are used instead.

It has been observed from practical tests that the invention achieves the intended aim and objects, providing a process which is capable of providing, at modest costs, substrates which have both metrological and processed alignment markings for accurate statistical investigation of alignment.

The invention thus conceived is susceptible to numerous modifications and variations, all of which are within the scope of the inventive concept. All the details may furthermore be replaced with other technically equivalent elements.

In practice, the materials employed, as well as the dimensions, may be any according to the requirements. For example, various materials may be used to form the substrate and layers. Such materials are known to those skilled in the art of semiconductor fabrication.

It is, therefore, to be understood that the foregoing description is provided by way of example only and in no way is intended on being limiting. The scope of the invention is defined in the appended claims and equivalents thereto.

We claim:

1. A method of producing metrological structures comprising the steps of:
   A. producing, on a substrate, metrological alignment markings according to a first predetermined pattern; and
   B. producing, on the substrate, isolated regions formed from a second layer of a second material, the isolated regions being physically separated from each other and arranged according to a second predetermined pattern so that the metrological markings and isolated regions are formed at predetermined positions.

2. A method as claimed in claim 1, wherein:
   step A includes steps of:
   depositing a first layer of a first material upon the substrate;
   masking portions of the first layer to provide masked portions of the first layer and leave portions of the first layer unmasked;
   removing at least some of the unmasked portions of the first layer, to uncover first portions of the substrate; and
   etching the first portions of the substrate, to provide the metrological alignment markings in the substrate; and
   step B includes steps of:
   removing remaining portions of the first layer;
   depositing the second layer of the second material on the substrate;
   depositing a third layer of a third material on the second layer;
   masking portions of the third layer to provide masked portions of the third layer and leave portions of the third layer unmasked; and
   removing the unmasked portions of the third layer, to uncover processed alignment markings formed from the isolated regions of the second layer.

3. A method as claimed in claim 2 further including, after step B, the steps of:
   measuring a distance between two of the isolated regions of the second layer;
   measuring a distance between two of the metrological alignment markings, the measuring steps providing measurement results; and
   analyzing the measurement results to derive statistical data.

4. A method as claimed in claim 2 further including the step of measuring a distance between one of the processed alignment markings and one of the metrological alignment markings.

5. A method as claimed in claim 2, further including, after step B, the steps of:
   depositing a fourth layer of a fourth material on the second layer with at least some portions of the fourth layer being disposed over the metrological alignment markings; and
   masking the portions of the fourth layer disposed over the metrological alignment markings.

6. A method as claimed in claim 5, wherein the second material is formed from silicon.

7. A method as claimed in claim 1, wherein the metrological alignment markings and the isolated regions are used for a direct measurement of errors introduced by alignment marking systems.

8. A method of producing metrological structures comprising the steps of:
   depositing a first layer of a first material upon a substrate;
   masking portions of the first layer to provide masked portions of the first layer and leave portions of the first layer unmasked;
   removing at least some of the unmasked portions of the first layer to uncover first portions of the substrate;
   etching the first portions of the substrate to provide metrological alignment markings in the substrate;
   removing remaining portions of the first layer to provide exposed portions of the substrate;
   depositing a second layer of a second material on the exposed portions of the substrate;
   depositing a third layer of a third material on the second layer;
   masking portions of the third layer to provide masked portions of the third layer and leave portions of the third layer unmasked, the unmasked portions of the third layer being disposed over the metrological alignment markings;
   removing the unmasked portions of the third layer to provide exposed portions of the second layer and leave unexposed portions of the second layer, the unexposed portions of the second layer being disposed under the masked portions of the third layer, the exposed portions of the second layer being disposed over the metrological alignment markings;
   removing the exposed portions of the second layer disposed over the metrological alignment markings; and etching the masked portions of the third layer, to uncover the processed alignment markings formed from at least some of the unexposed portions of the second layer.

9. A method as claimed in claim 8 further including, after the step of removing remaining portions of the third layer, the steps of:

measuring a distance between two of the processed alignment markings;

measuring a distance between two of the metrological alignment markings, the measuring steps providing measurement results; and analyzing the measurement results.

10. A method as claimed in claim 8, further comprising the step of measuring a distance between one of the processed alignment markings and one of the metrological alignment markings.

11. A method as claimed in claim 8 further including, after the step of etching the masked portions of the third layer, the steps of:

depositing a fourth layer of a fourth material upon the second layer;

masking portions of the fourth layer to provide masked portions of the fourth layer and leave portions of the fourth layer unmasked, at least some of the unmasked portions of the fourth layer being disposed over the metrological alignment markings; and removing the unmasked portions of the fourth layer disposed over the metrological alignment markings so that at least some of the processed alignment markings of the second layer remain covered by the fourth layer.

12. A method as claimed in claim 8, wherein the second material is formed from silicon.

13. A method of producing metrological structures comprising the steps of:

depositing a first layer of a first material upon a substrate;

depositing a second layer of a second material on the first layer;

masking portions of the second layer to provide masked portions of the second layer and leave portions of the second layer unmasked;

removing the unmasked portions of the second layer to uncover first portions of the first layer;

etching the first portions of the first layer to uncover portions of the substrate;

removing remaining portions of the second layer;

depositing a third layer of the second material on the first layer;

masking portions of the third layer with an array of markings to provide masked portions of the third layer and leave portions of the third layer unmasked, each marking in the array of markings being equidistant from each of its neighboring markings;

removing the unmasked portions of the third layer to uncover portions of the first layer and first portions of the substrate;

etching the first portions of the substrate to provide metrological alignment markings in the substrate:

depositing a fourth layer of the second material on the third layer, the metrological alignment markings, and the uncovered portions of the first layer;

masking portions of the fourth layer to provide masked portions of the fourth layer and leave portions of the fourth layer unmasked;

removing the unmasked portions of the fourth layer to uncover the first portions of the first layer;

etching the first portions of the first layer to uncover portions of the substrate and provide processed alignment markings formed from the first layer;

removing remaining portions of the third and fourth layers;

depositing a fifth layer of a third material on the substrate and the processed alignment markings;

depositing a sixth layer of the second material on the fifth layer;

masking portions of the sixth layer to provide masked portions of the sixth layer and leave portions of the sixth layer unmasked;

removing the unmasked portions of the sixth layer to uncover first portions of the fifth layer arranged over the metrological alignment markings;

etching the first portions of the fifth layer, to expose the metrological alignment markings; and removing the remaining portions of the sixth layer to uncover the processed alignment markings covered by the fifth layer.

14. A method as claimed in claim 13 further including, after the step of removing the remaining portions of the sixth layer, the steps of:

measuring a distance between two of the processed alignment markings;

measuring a distance between two of the metrological alignment markings, the measuring steps providing measurement results; and analyzing the measurement results to derive statistical data.

15. A method as claimed in claim 13 further including, after the step of removing remaining portions of the sixth layer, the steps of:

depositing a seventh layer of the second material on the fifth layer;

masking portions of the seventh layer; and removing unmasked portions of the seventh layer over the metrological alignment markings, to define portions of the fifth layer covered by portions of the seventh layer.

16. A method as claimed in claim 15, wherein the second material is formed from silicon.

17. A method as claimed in claim 16, wherein the metrological alignment markings and the processed alignment markings are used for a direct measurement of errors introduced by alignment systems.

18. A process for testing an alignment system used in semiconductor fabrication, comprising the steps of:

A. producing, on a semiconductor substrate, metrological markings according to a first predetermined pattern;

B. producing, on the semiconductor substrate, processed markings according to a second predetermined pattern;

C. measuring a distance between two of the metrological markings, a distance between two of the processed markings or a distance between one of the metrological markings and one of the processed markings to derive measurement results; and D. analyzing the measurement results to ascertain an error in the alignment system.

19. The process of claim 18, wherein step C includes using an interferometric mechanical bench.

20. The process of claim 19, wherein step C includes a step of correlating a position where at least one of a metrological marking and a processed marking is detected with a coordinate on an X/Y plane of the interferometric mechanical bench.

21. The process of claim 18, wherein step C includes measuring distances between two metrological markings to remove an effect of a cosine error.

22. The process of claim 18, wherein step C includes performing said measurements in a sequence based upon a characteristic of the alignment system.

23. The process of claim 18, wherein step A includes the steps of:

depositing a first layer on the substrate;

masking the first layer according to the first predetermined pattern to provide masked portions of the first layer and leave portions of the first layer unmasked; and etching the unmasked portions of the first layer and portions of the substrate to produce the metrological markings.

24. The process of claim 23, wherein step A includes etching the first layer completely away.

25. The process of claim 23, wherein the first layer is formed from a photoresist material.

26. The process of claim of claim 18, wherein step B include a step of depositing a second layer over the substrate.

27. The process of claim 26, wherein the second layer is formed from a silicon material.

28. The process of claim 26, wherein the second layer is formed from a polysilicon material.

29. The process of claim 26, wherein the second layer is formed from a metal.

30. The process of claim 26, wherein step B includes a step of depositing a third layer over the substrate.

31. The process of claim 30, wherein the third layer is formed from a photoresist material.

32. The process of claim 30, wherein step B further includes a step of masking the third layer according to the second predetermined pattern.

33. The process of claim 32, further including the steps of:

removing portions of the third layer; and uncovering portions of the second layer.

34. The process of claim 33, wherein the processed markings overlap the metrological markings.

35. The process of claim 34, wherein the uncovered portions of the second layer are arranged over the metrological markings.

36. The process of claim 35, further including the steps of:

etching the uncovered portions of the second layer; and removing portions of the third layer to define the processed markings.

37. The process of claim 35, further including the steps of:

depositing a fourth layer of photoresist over the substrate;

masking the fourth layer to provide masked portions of the fourth layer and to leave portions of the third layer unmasked; and removing at least some of the unmasked portions of the fourth layer.

38. The process of claim 34, further including the steps of:

etching the uncovered portions of the second layer; and removing portions of the third layer to define the processed markings.

39. The process of claim 18, wherein step C includes a step of measuring a distance between two of the processed markings.

40. The process of claim 39, wherein step C further includes a step of measuring a distance between two of the metrological markings.

41. The process of claim 18, further including a step of measuring a distance between one of the processed markings and one of the metrological markings.

42. The process of claim 18, wherein step B includes a step of producing the processed markings such that at least one of the processed marking is immediately adjacent to at least three metrological markings.

43. The process of claim 18, wherein steps A and B include establishing hundreds of markings formed from metrological markings and processed markings.

44. The process of claim 18, wherein step C includes performing hundreds of measurements to provide a level of statistical significance.

45. A method, comprising steps of:

A. producing metrological alignment markings in a substrate; and

B. producing processed alignment markings on the substrate including at least first and second processed alignment markings, the first processed alignment marking being physically separated from the second processed alignment marking.

46. The method according to claim 45, wherein step A includes steps of:

depositing a first layer on the substrate;

masking the first layer to provide masked portions of the first layer and unmasked portions of the first layer;

removing the unmasked portions of the first layer to uncover first portions of the substrate; and etching the first portions of the substrate to provide the metrological alignment markings in the substrate.

47. The method according to claim 46, wherein step B includes steps of:

depositing a second layer of a second material on the substrate;

depositing a third layer of a third material on the second layer;

masking the third layer to provide masked portions of the third layer and unmasked portions of the third layer;

removing the unmasked portions of the third layer to uncover portions of the second layer and leave covered portions of the second layer disposed under the masked portions of the third layer; and etching the uncovered portions of the second layer to provide the processed alignment markings from at least some of the covered portions of the second layer.

48. The method according to claim 45, wherein step B includes steps of:

depositing a second layer of a second material on the substrate;

depositing a third layer of a third material on the second layer;

masking the third layer to provide masked portions of the third layer and unmasked portions of the third layer;

removing the unmasked portions of the third layer to uncover portions of the second layer and leave covered portions of the second layer disposed under the masked portions of the third layer; and etching the uncovered portions of the second layer to provide the processed alignment markings from at least some of the covered portions of the second layer.

49. The method according to claim 45, further comprising steps of:

measuring a distance between two of the metrological alignment markings in the substrate; and measuring a distance between two of the processed alignment markings on the substrate, the measuring steps providing measurement results.

50. The method according to claim 49, further comprising a step of analyzing the measurement results.

51. The method according to claim 50, wherein the step of analyzing the measurement results includes statistically analyzing the measurement results.

52. A method comprising steps of:
A. producing metrological alignment markings in a substrate; and
B. producing processed alignment markings on the substrate including at least first and second processed alignment markings, the first processed alignment marking being in direct physical contact with at least one of the metrological alignment markings, the second processed alignment marking being physically separated from each of the metrological alignment markings.

53. The method according to claim 52, wherein step A includes producing the metrological alignment markings in a predetermined pattern.

54. The method according to claim 53, wherein step B includes producing the processed alignment markings in a predetermined pattern.

55. The method according to claim 52, further comprising a step of measuring a distance between two of the metrological alignment markings.

56. The method according to claim 52, further comprising a step of measuring a distance between two of the processed alignment markings.

57. The method according to claim 52, further comprising a step of:
measuring a distance between one of the processed alignment markings and one of the metrological alignment markings.

58. The method according to claim 52, further comprising steps of:
measuring a distance between two of the metrological alignment markings;
measuring a distance between two of the processed alignment markings, the measuring steps providing measurement results; and
analyzing the measurement results.

59. The method according to claim 58, wherein the step of analyzing the measurement results includes statistically analyzing the measurement results.

60. The method according to claim 58, wherein the step of analyzing the measurement results includes removing an effect of cosine error.

61. The method according to claim 60, wherein the step of analyzing the measurement results includes using an interferometric mechanical bench.

62. The method according to claim 52, wherein step A includes steps of:
depositing a first layer on the substrate;
masking the first layer according to a first predetermined pattern to provide masked portions of the first layer and unmasked portions of the first layer;
removing the unmasked portions of the first layer to form uncovered portions of the substrate: and
etching the uncovered portions of the substrate to provide the metrological alignment markings in the substrate.

63. The method according to claim 62, wherein step B includes steps of:

depositing a second layer of a second material on the substrate;
depositing a third layer of a third material on the second layer;
masking the third layer according to a second predetermined pattern to provide masked portions of the third layer and unmasked portions of the third layer;
removing the unmasked portions of the third layer to uncover portions of the second layer and leave covered portions of the second layer disposed under the masked portions of the third layer; and
etching the uncovered portions of the second layer to provide the processed alignment markings from at least some of the covered portions of the second layer.

64. The method according to claim 52, wherein step B includes steps of:
depositing a second layer of a second material on the substrate;
depositing a third layer of a third material on the second layer;
masking the third layer according to a second predetermined pattern to provide masked portions of the third layer and unmasked portions of the third layer;
removing the unmasked portions of the third layer to uncover portions of the second layer and leave covered portions of the second layer disposed under the masked portions of the third layer; and
etching the uncovered portions of the second layer to provide the processed alignment markings from at least some of the covered portions of the second layer.

65. A method comprising steps of:
A. producing metrological alignment markings in a substrate;
B. producing processed alignment markings on the substrate, at least one of the processed alignment markings being physically separated from each of the metrological alignment markings; and
C. using the metrological alignment markings and the processed alignment markings to measure an error in a semiconductor fabrication alignment system.

66. The method according to claim 65, wherein step A includes steps of:
depositing a first layer on the substrate;
masking the first layer to provide masked portions of the first layer and unmasked portions of the first layer;
removing the unmasked portions of the first layer to uncover first portions of the substrate; and
etching the first portions of the substrate to provide the metrological alignment markings in the substrate.

67. The method according to claim 66, wherein step B includes steps of:
depositing a second layer of a second material on the substrate;
depositing a third layer of a third material on the second layer;
masking the third layer to provide masked portions of the third layer and unmasked portions of the third layer;
removing the unmasked portions of the third layer to uncover portions of the third layer and leave covered portions of the second layer disposed under the masked portions of the third layer; and
etching the uncovered portions of the second layer to provide the processed alignment markings on the substrate from at least some of the covered portions of the second layer.

68. The method according to claim 65, wherein step C includes steps of:

measuring a distance between two of the metrological alignment markings; and measuring a distance between two of the processed alignment markings, the measuring steps providing measurement results.

69. The method according to claim 68, further comprising a step of analyzing the measurement results to measure the error in the semiconductor fabrication alignment system.

70. The method according to claim 69, wherein the step of analyzing the measurement results includes removing an effect of cosine error.

* * * * *